United States Patent
Uemura et al.

(10) Patent No.: US 8,853,720 B2
(45) Date of Patent: Oct. 7, 2014

(54) GROUP III NITRIDE SEMICONDUCTOR LIGHT-EMITTING DEVICE AND METHOD FOR PRODUCING THE SAME

(75) Inventors: Toshiya Uemura, Aichi (JP); Naoki Arazoe, Aichi (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 541 days.

(21) Appl. No.: 12/801,456

(22) Filed: Jun. 9, 2010

(65) Prior Publication Data

US 2010/0327312 A1  Dec. 30, 2010

(30) Foreign Application Priority Data

Jun. 24, 2009  (JP) ............................. P.2009-150341

(51) Int. Cl.
| | | |
|---|---|---|
| H01L 33/00 | (2010.01) | |
| H01L 33/44 | (2010.01) | |
| H01L 33/20 | (2010.01) | |
| H01L 33/22 | (2010.01) | |

(52) U.S. Cl.
CPC ............... *H01L 33/20* (2013.01); *H01L 33/44* (2013.01); *H01L 33/007* (2013.01); *H01L 33/0079* (2013.01); *H01L 33/22* (2013.01)
USPC ..................................... 257/98; 257/E33.067

(58) Field of Classification Search
None
See application file for complete search history.

(56) References Cited

U.S. PATENT DOCUMENTS

| | | | |
|---|---|---|---|
| 7,800,120 B2 | 9/2010 | Furukawa et al. | |
| 7,915,619 B2 | 3/2011 | Nabekura et al. | |
| 2004/0169191 A1* | 9/2004 | Udagawa | 257/99 |
| 2008/0035953 A1 | 2/2008 | Beom et al. | |
| 2008/0164457 A1* | 7/2008 | Furukawa et al. | 257/13 |
| 2009/0026476 A1* | 1/2009 | Tazima et al. | 257/98 |
| 2011/0133238 A1 | 6/2011 | Nabekura et al. | |

FOREIGN PATENT DOCUMENTS

| | | |
|---|---|---|
| JP | 2006-190854 A | 7/2006 |
| JP | 2007-173534 A | 7/2007 |
| JP | 2008-47861 | 2/2008 |
| JP | 2008-53344 A | 3/2008 |
| JP | 2008-153584 A | 7/2008 |

OTHER PUBLICATIONS

Notification of Reason(s) for Refusal issued on Oct. 18, 2011, with English translation.

* cited by examiner

*Primary Examiner* — Benjamin Sandvik
(74) *Attorney, Agent, or Firm* — McGinn IP Law Group, PLLC

(57) ABSTRACT

A group III nitride semiconductor light-emitting device includes: a conductive support; a p-electrode positioned on the support, a p-type layer containing a group III nitride semiconductor, an active layer and an n-type layer having a first surface, which are positioned in turn on the p-electrode; and an n-electrode positioned on the first surface of the n-type layer. A groove is formed in the first surface of the n-type layer in a pattern such that the first surface of the n-type layer is continuous. A light-transmitting insulating film is formed on side surface and bottom surface of the groove. The groove has a depth at least reaching the p-type layer. The n-electrode is formed in wiring form.

14 Claims, 3 Drawing Sheets

GROUP III NITRIDE SEMICONDUCTOR LIGHT-EMITTING DEVICE AND METHOD FOR PRODUCING THE SAME

BACKGROUND OF THE INVENTION

1. Technical Field

The present invention relates to a method for producing a group III nitride semiconductor light-emitting device including the step of removing a growth substrate by a substrate lift-off process, and a group III nitride semiconductor light-emitting device produced thereby.

2. Description of Related Art

A sapphire substrate is generally used as a growth substrate of a group III nitride semiconductor. However, sapphire has problems with respect to electrical conductivity and thermal conductivity, and has no clear cleavage surface, so that processing thereof is not easy. Accordingly, as techniques for solving these problems, there have been developed techniques (substrate lift-off) of allowing the group III nitride semiconductor to grow on the growth substrate, and then, removing the growth substrate.

One of the techniques is a laser lift-off process. This is a process of joining the group III nitride semiconductor layer to a support substrate, and then, irradiating an interface between the growth substrate and the group III nitride semiconductor with a laser beam to decompose the group III nitride semiconductor layer, thereby separating and removing the growth substrate. Further, as another technique, there has also been known a process of introducing a chemical solution soluble layer as a layer close to the growth substrate of the group III nitride semiconductor layer, joining the group III nitride semiconductor layer to a support substrate, and then, dissolving the above-mentioned chemical solution soluble layer with a desired chemical solution, thereby removing the growth substrate (chemical lift-off process).

When the laser lift-off process is applied to the preparation of a light-emitting device, since the group III nitride semiconductor layer has a structure of an n-type layer, an active layer and a p-type layer from the growth substrate side, a surface of the group III nitride semiconductor layer becomes a surface of the n-type layer. In the related-art structure, a fine concavo-convex processing is performed by wet etching on a surface of the n-type layer which is exposed by the removal of this growth substrate, in order to enhance the light taking-out efficiency. However, there are variations in the concavo-convex processing by wet etching, and flat regions and unevenness regions having a depth not effective for the light taking-out efficiency remain in places. Further, unevenness is formed in six-sided pyramid form in which side surfaces equally have an angle of about 60 degrees. Furthermore, the distance between the convex portions is narrow, so that light once emitted outside from the convex portion enters again the inside of the n-type layer from the convex portion in some cases. For these reasons, the light taking-out efficiency has not been able to be sufficiently enhanced only by forming fine unevenness.

JP-A-2008-47861 shows a method for improving the light taking-out efficiency by performing a two-step concavo-convex processing. Specifically, concave portions having a grid pattern are formed on an exposed surface of the n-type layer by etching using a mask, and then, fine unevenness is formed on the surface of the n-type layer and bottom surfaces of the concave portions by wet etching.

SUMMARY OF THE INVENTION

However, when the concave portions are formed in grid form as described in JP-A-2008-47861, a thin portion and a thick portion are formed in the n-type layer, which causes an increase in driving voltage, in exchange for improvement of the light taking-out efficiency.

An object of the invention is to provide a group III nitride semiconductor light-emitting device improved in the light taking-out efficiency without increasing driving voltage, and a method for producing the same.

According to an aspect of the invention, there is provided a group III nitride semiconductor light-emitting device comprising: a conductive support; a p-electrode positioned on the support, a p-type layer containing a group III nitride semiconductor, an active layer and an n-type layer having a first surface, which are positioned in turn on the p-electrode; and an n-electrode positioned on the first surface of the n-type layer, wherein a groove is formed in the first surface of the n-type layer in a pattern such that the first surface of the n-type layer is continuous, wherein a light-transmitting insulating film is formed on side surface and bottom surface of the groove, wherein the groove has a depth at least reaching the p-type layer, and wherein the n-electrode is formed in wiring form.

According to another aspect of the invention, there is provided a method for producing a group III nitride semiconductor light-emitting device, said method comprising: a first step for laminating an n-type layer which contains a group III nitride semiconductor, an active layer and a p-type layer on a growth substrate, and forming a p-electrode on the p-type layer; a second step for forming a conductive support on the p-electrode; a third step for separating and removing the growth substrate by substrate lift-off; a fourth step for forming a groove in a first surface of the n-type layer which is exposed by removal of the growth substrate such that the groove having a depth at least reaching the p-type layer so as to have a pattern in which the first surface of the n-type layer is continuous; and a fifth step for forming a light-transmitting insulating film on a side surface of the groove, and forming a wiring-shaped n-electrode on the first surface of the n-type layer.

DETAILED DESCRIPTION OF THE EXEMPLARY EMBODIMENT

Figure 1:
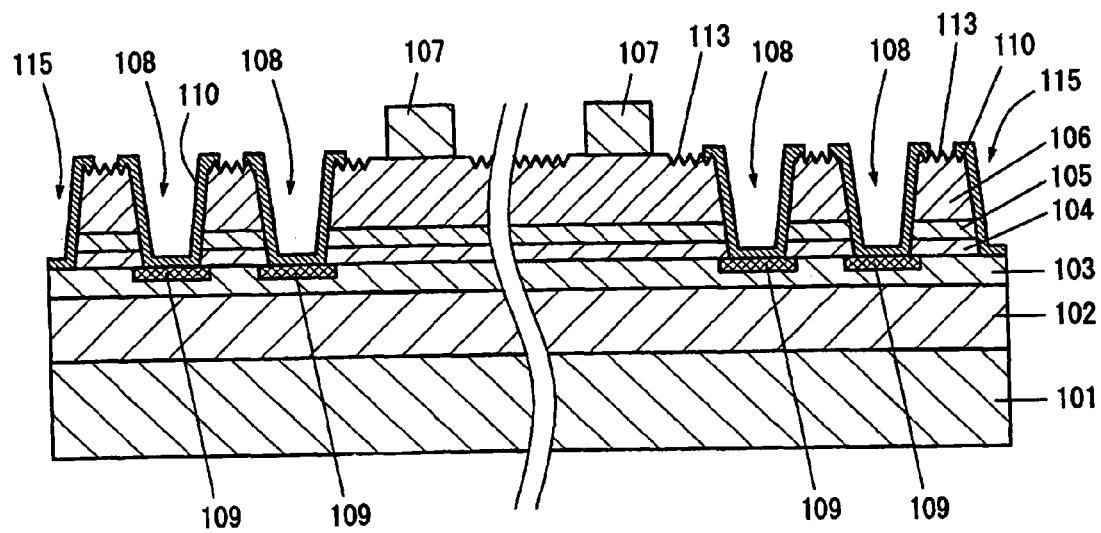
FIG. 1 is a cross-sectional view showing a structure of a light-emitting device of Example 1.

A group III nitride semiconductor light-emitting device according to a first aspect of the embodiment includes: a conductive support; a p-electrode positioned on the support, a p-type layer containing a group III nitride semiconductor, an active layer and an n-type layer having a first surface, which are positioned in turn on the p-electrode; and an n-electrode positioned on the first surface of the n-type layer, wherein a groove is formed in the first surface of the n-type layer in a pattern such that the first surface of the n-type layer is continuous, wherein a light-transmitting insulating film is formed on side surface and bottom surface of the groove, wherein the groove has a depth at least reaching the p-type layer, and wherein the n-electrode is formed in wiring form.

The group III nitride semiconductor as used herein is a semiconductor represented by the general formula $Al_xGa_yIn_z$ ($x+y+z=1$, $0 \le x,y,z \le 1$), and may include one in which a part of Al, Ga and In is partially substituted by another group 13 element(s) such as B and Tl and one in which a part of N partially substituted by another group 15 element(s) such as P, As, Sb and Bi. More generally, the group III nitride semiconductor may include GaN, InGaN, AlGaN or AlGaInN, which contains at least Ga. Si is usually used as an n-type impurity, and Mg as a p-type impurity.

The groove pattern may be any pattern as long as the first surface (a surface closer to the n-electrode) left even after the formation of the groove is continuous i.e., is not separated by the groove. Further, the proportion of the area of grooves to the area of the light-emitting device is preferably from 5 to 50%. When it is less than 5%, the effect of improving the light taking-out efficiency by providing the grooves is insufficient. When it is more than 50%, a decrease in light-emitting area by providing the grooves causes a reduction in output.

When a plurality of dot-shaped grooves are formed, the dot shape may be a shape such as a pyramidal, conical, prismoidal, circular truncated conical, rectangular cylindrical, circular cylindrical or indeterminate shape. When the grooves have the conical, circular truncated conical or circular cylindrical shape, the diameter thereof on the first surface of the n-type layer is preferably from 0.1 to 50 µm. The shapes of the respective grooves may be the same or different. The side surface of the groove may be inclined so that the cross-sectional area increases from a p-type layer side to an n-type layer side. The angle of the side surface of the groove to a device surface is preferably from 60 to 90 degrees, and more preferably from 70 to 85 degrees.

The groove may penetrate the n-type layer, the active layer and the p-type layer, which can improve the light taking-out efficiency. Further, when the groove penetrates, it is preferable to provide an etching stopper layer on a surface of the p-type layer at a position opposing the groove formed later from the first surface of the n-type layer. A material of the etching stopper layer may be any material having resistance to etching at the time of groove formation. The etching stopper layer is, for example, an insulating film such as $SiO_2$ or SiN, or a metal such as Ni or Al. When the metal is used, a p-electrode may serve as the etching stopper layer.

Further, when the plurality of dot-shaped grooves are formed, the grooves may be provided at even intervals in a region where no n-electrode is formed, for example, by arranging the grooves in matrix form. This arrangement does not deteriorate current diffusion properties in a device surface direction. Further, the arrangement of the grooves forms photonic band gaps in an emission wavelength band in the device surface direction to inhibit emission of light in the device surface direction, thereby also being able to improve the light taking-out efficiency.

The n-electrode may be formed in a wiring-shaped pattern such as comb, stripe or grid form, for the purposes of improving the current diffusion properties in the device surface direction, equalizing light emission and inhibiting an increase in driving voltage.

Fine unevenness may be formed on the first surface of the n-type layer, for example, by using wet etching. The light taking-out efficiency can be more improved by the fine unevenness. The fine unevenness is formed on the first surface of the n-type layer, and a region where the n-electrode is formed is preferably left flat without forming the fine unevenness. This is because the light multiply reflects by the fine unevenness under the n-electrode to attenuate, resulting in a decrease in the light taking-out efficiency.

Sapphire is generally used as the growth substrate. In addition, SiC, ZnO, spinel or the like can be used. Further, as a support, there can be used a substrate of Si, Ge, GaAs, Cu, Cu—W or the like. The p-electrode can be formed on the support by joining the p-electrode to the support through a metal layer. As the metal layer, there can be used a metal eutectic layer such as an Au—Sn layer, an Au—Si layer, an Ag—Sn—Cu layer or an Sn—Bi layer. An Au layer, an Sn layer, a Cu layer or the like can also be used. Further, a metal layer such as Cu may be directly formed on the p-electrode by plating, sputtering or the like to form the support.

The insulating film may be formed in film form on the side surface and the bottom surface of the groove, or formed so as to fill the groove. When formed in film form, the insulating film may be a multilayer film. A material of the insulating film may be a material having a refractive index lower than that of a material constituting the n-type layer, the active layer or the p-type layer. For example, the material of the insulating film may be $SiO_2$, $ZrO_2$ or the like.

A second aspect of the embodiment provides the group III nitride semiconductor light-emitting device according to the first aspect, wherein the pattern is a pattern in which a plurality of dot-shaped grooves are formed.

A third aspect of the embodiment provides the group III nitride semiconductor light-emitting device according to a second aspect, wherein the grooves are arranged in matrix form.

A fourth aspect of the embodiment provides the group III nitride semiconductor light-emitting device according to any one of the first to third aspects, wherein the groove penetrates the p-type layer.

A fifth aspect of the embodiment provides the group III nitride semiconductor light-emitting device according to the fourth aspect, wherein an etching stopper layer is formed on the bottom surface of the groove.

A sixth aspect of the embodiment provides a method for producing a group III nitride semiconductor light-emitting device, said method including: a first step for laminating an n-type layer which contains a group III nitride semiconductor, an active layer and a p-type layer on a growth substrate, and forming a p-electrode on the p-type layer; a second step for forming a conductive support on the p-electrode; a third step for separating and removing the growth substrate by substrate lift-off; a fourth step for forming a groove in a first surface of the n-type layer which is exposed by removal of the growth substrate such that the groove having a depth at least reaching the p-type layer so as to have a pattern in which the first surface of the n-type layer is continuous; and a fifth step for forming a light-transmitting insulating film on a side surface of the groove, and forming a wiring-shaped n-electrode on the first surface of the n-type layer.

A seventh aspect of the embodiment provides a method for producing a group III nitride semiconductor light-emitting device according to the sixth aspect, wherein the fourth step is a step for forming a plurality of dot-shaped grooves.

A eighth aspect of the embodiment provides the method for producing a group III nitride semiconductor light-emitting device according to the seventh aspect, wherein the fourth step is a step for forming the plurality of dot-shaped grooves in a pattern in which the grooves are arranged in matrix form.

A ninth aspect of the embodiment provides the method for producing a group III nitride semiconductor light-emitting device according to any of sixth to eighth aspects, wherein the fourth step is a step for forming the groove to have a depth so as to penetrate the p-type layer.

A tenth aspect of the embodiment provides the method for producing a group III nitride semiconductor light-emitting device according to ninth aspect, wherein the first step includes forming an etching stopper layer on a second surface of the p-type layer on which the p-electrode, at a position opposing a position where the groove is formed.

An eleventh aspect of the embodiment provides the method for producing a group III nitride semiconductor light-emitting device according to any of sixth to tenth aspects, wherein the fourth step is a step for forming a mesa groove for device separation at the same time of formation of the groove.

According to the first aspect of the embodiment, the light which enters the side surface of the groove can be efficiently emitted outside, which can improve the light taking-out efficiency and also improve the light output. Further, the groove penetrates the n-type layer, so that the thickness of the n-type layer is even except for the region where the groove is formed, and the first surface of the n-type layer is not divided by the groove. Accordingly, there is no increase in driving voltage caused by providing the grooves.

According to the second to fourth aspects, the light taking-out efficiency can be more improved.

According to the fifth aspect, the groove having a depth reaching the etching stopper layers can be easily formed with good precision.

According to the sixth to tenth aspects, the group III nitride semiconductor light-emitting device having a high light taking-out efficiency can be produced.

According to the eleventh aspect, the groove can be formed at the same time as the formation of the mesa groove for device separation, so that the group III nitride semiconductor light-emitting device having a high light taking-out efficiency can be produced at the same process number as that of related-art method.

Specific examples of the invention will be described below with reference to the drawings. However, it should be noted that the invention is not limited to the examples.

FIG. 1 is a cross-sectional view showing a structure of a light-emitting device 100 of Example 1. The light-emitting device 100 includes: a support 101; a p-electrode 103 joined onto the support 101 through a low-melting-point metal layer 102, a p-type layer 104 containing a group III nitride semiconductor, an active layer 105 and an n-type layer 106, which are laminated in turn on the p-electrode 103; and an n-electrode 107 formed on the n-type layer 106.

As the support 101, there can be used a conductive substrate containing Si, GaAs, Cu, Cu—W or the like. As the low-melting-point metal layer 102, there can be used a metal eutectic layer such as an Au—Sn layer, an Au—Si layer, an Ag—Sn—Cu layer or an Sn—Bi layer. An Au layer, an Sn layer, a Cu layer or the like can also be used, although not a low-melting-point metal. Incidentally, a metal layer such as Cu may be directly formed on the p-electrode 103 by plating, sputtering or the like to form the support 101, instead of joining the support 101 to the p-electrode 103 by using the low-melting-point metal layer 102. As the p-electrode 103, there can be used a metal having a high light reflectance and a low contact resistance such as Ag, Rh, Pt, Ru or an alloy containing each of these metals as a main component thereof, Ni, an Ni alloy, an Au alloy or the like. Further, it may be a composite film including a transparent electrode film such as ITO and a high reflective metal film.

The p-type layer 104, the active layer 105 and the n-type layer 106 may have any configuration which has been known as a configuration of a light-emitting device. The p-type layer 104 has, for example, a structure in which a p-contact layer containing GaN and doped with Mg and a p-clad layer containing AlGaN and doped with Mg are laminated in turn from the side closer to the support 101. The active layer 105 has, for example, an MQW structure in which a barrier layer containing GaN and a well layer containing InGaN are repeatedly laminated. The n-type layer 106 has, for example, a structure in which a clad layer containing GaN and an n-type contact layer containing GaN and highly doped with Si are laminated in turn from the side closer to the active layer 105.

A plurality of dot-shaped grooves 108 are formed in a region where no n-electrode 107 is formed, on a first surface of the n-type layer 106 on which the n-electrode 107 is joined. The grooves 108 penetrate the n-type layer 106, the active layer 105 and the p-type layer 104, and have a depth reaching etching stopper layers 109. The etching stopper layers 109 contain $SiO_2$, and are provided in regions where the grooves 108 are formed on a second surface of the p-type layer 104 on which the p-electrode is joined. A material of the etching stopper layer 109 may be any material as long as the material has resistance to dry etching at the time of forming the grooves 108. Besides $SiO_2$, a metal such as Ni or Al or a dielectric material such as $Si_3N_4$ can be used. The shape of the groove 108 is a circular truncated conical shape in which the cross-sectional area in a device surface direction increase as proceeding from the p-type layer 104 to the n-type layer 106. Further, a light-transmitting insulating film 110 is formed on a side surface of the groove 108, in order to prevent leak and short circuit of current. In place of the insulating film 110, the groove 108 may be filled with a light-transmitting insulating material. As the insulating film 110, there can be used $SiO_2$, $ZrO_2$ or the like.

The shape of the groove 108 is not limited to the circular truncated conical shape as described above, and may be any shape such as a pyramidal, conical, prismoidal or indeterminate shape. The side surface of the groove 108 may be inclined with respect to the device surface, preferably from 60 to 90 degrees, more preferably from 70 to 85 degrees. This is because the light taking-out efficiency can be more improved.

Figure 2:
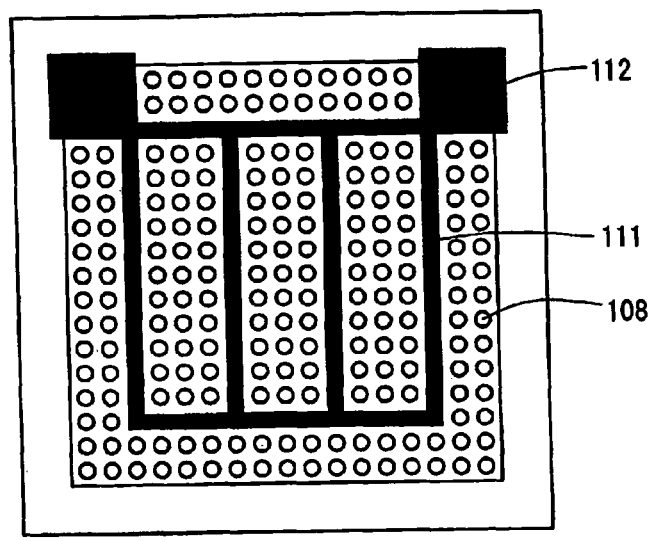
FIG. 2 is a plan view showing the structure of the light-emitting device of Example 1.

FIG. 2 is a plan view of the light-emitting device 100 viewed from the n-electrode side. The n-electrode 107 includes a wiring-shaped portion 111 and two pad portions 112, as shown in FIG. 2. The two pad portions 112 are each arranged in two corner portions closer to one side of the square light-emitting device 100. The wiring-shaped portion 111 is formed in a pattern, in which rectangles are aligned along a direction in which shorter sides of the rectangles extend such that the sides of each of the rectangles are arranged parallel to the sides of the square as a planar shape of the light-emitting device 100, and connected to the two pad portions 112. As the n-electrode 107, there is used, for example, Cr/Ti/Ni/Au or the like.

As shown in FIG. 2, the grooves 108 are arranged in matrix form in a region where no n-electrode 107 is formed. The grooves 108 are not necessarily arranged in such matrix form. However, in order to uniformly diffuse the current in the device surface direction and to equalize light emission, it is preferable that the grooves 108 are provided at even intervals.

Fine unevenness 113 is formed on the first surface of the n-type layer 106 on which the n-electrode 107 is joined, except for a region where the n-electrode 107 is formed. The fine unevenness 113 is formed by a number of minute six-sided pyramids, and side surfaces of the six-sided pyramids have an angle of about 60 degrees with respect to the device surface. The light taking-out efficiency is improved by the fine unevenness 113. A region reserved for forming the n-electrode 107 on the first surface of the n-type layer 106 is left flat without forming the fine unevenness 113, in order to prevent that the light multiply reflects between the n-electrode 107 and the fine unevenness 113 to attenuate, which results in deterioration of the light taking-out efficiency.

In this light-emitting device 100, the light which enters the side surfaces of the grooves 108, that is to say, the light which exits from side walls of the p-type layer 104, the active layer 105 and the n-type layer 106 to the grooves 108, can be efficiently emitted outside. Further, the grooves 108 penetrate the n-type layer 106, so that the thickness of the n-type layer 106 is even, and the grooves 108 are formed in dot form, so that the n-type layer 106 is not divided by the grooves 108, in other words, there is no island-shaped isolated portion. Accordingly, the current can be easily diffused in the device surface direction by the wiring-shaped portion 111 of the n-electrode 107. For this reason, the increase of the driving voltage caused by the formation of the grooves 108 does not occur. Therefore, according to the configuration of the light-emitting device 100, the light taking-out efficiency can be improved without increasing the driving voltage.

The method for producing the light-emitting device 100 will be described below with reference to FIGS. 3A to 3F.

Figure 3A:
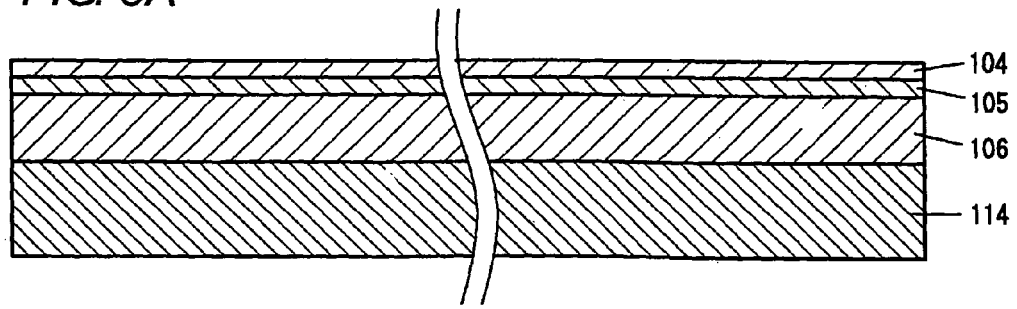
FIG. 3A is a view showing a production process of the light-emitting device of Example 1.

First, the p-type layer 104 containing the group III nitride semiconductor, the active layer 105 and the n-type layer 106 are laminated in turn on a sapphire substrate 114 (an example of the growth substrate) by an MOCVD process (FIG. 3A). Raw material gases used in the MOCVD process are ammonia ($NH_3$) as a nitrogen source, trimethylgallium ($Ga(CH_3)_3$) as a Ga source, trimethylindium ($In(CH_3)_3$) as an In source, trimethylaluminum ($Al(CH_3)_3$) as an Al source, silane ($SiH_4$) as an n-type doping gas, cyclopentadienylmagnesium ($Mg(C_5H_5)_2$) as a p-type doping gas, and $H_2$ or $N_2$ as a carrier gas. Besides the sapphire substrate 114, there can be used SiC, ZnO, spinel or the like.

Figure 3B:
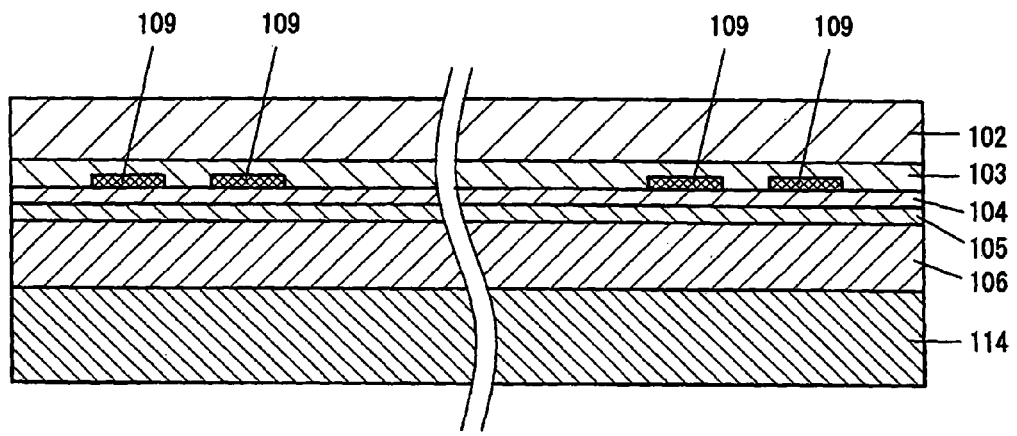
FIG. 3B is a view showing a production process of the light-emitting device of Example 1.

Next, the etching stopper layers 109 containing $SiO_2$ are formed in positions which oppose positions where the grooves 108 are formed later, on the p-type layer 104, by using a CVD process, photolithography and dry etching, and the p-electrode 103 is formed on almost entire surfaces of the p-type layer 104 and the etching stopper layers 109 by a vapor-deposition process. Further, the low-melting-point metal layer 102 is formed on the p-electrode 103 (FIG. 3B).

Figure 3C:
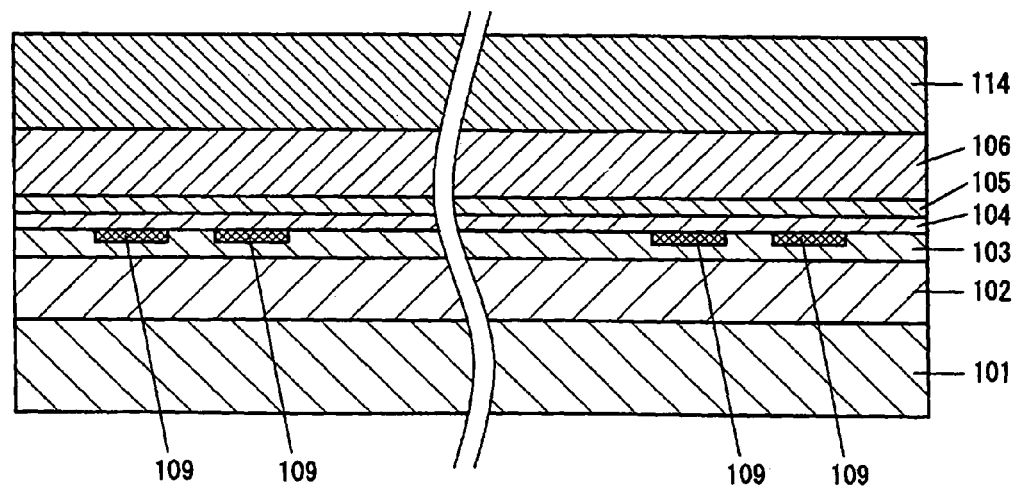
FIG. 3C is a view showing a production process of the light-emitting device of Example 1.

Then, the support 101 is prepared, and joined to the p-electrode 103 through the low-melting-point metal layer 102 (FIG. 3C). It is preferable that a diffusion-preventing layer (not shown) is previously formed between the p-electrode 103 and the low-melting-point metal layer 102 so as to prevent a metal of the low-melting-point metal layer 102 from diffusing to the side of the p-electrode 103.

Figure 3D:
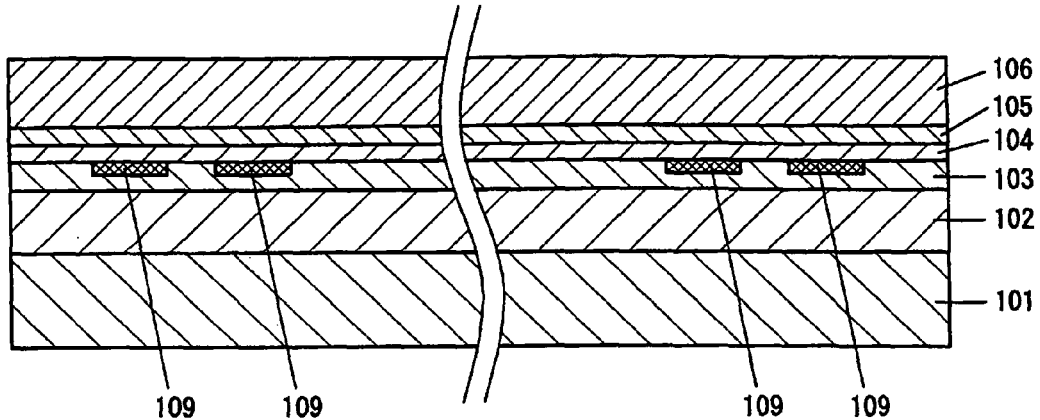
FIG. 3D is a view showing a production process of the light-emitting device of Example 1.

Thereafter, a laser beam is irradiated from the side of the sapphire substrate 114 to separate and remove the sapphire substrate 114 by laser lift-off (FIG. 3D).

Figure 3E:
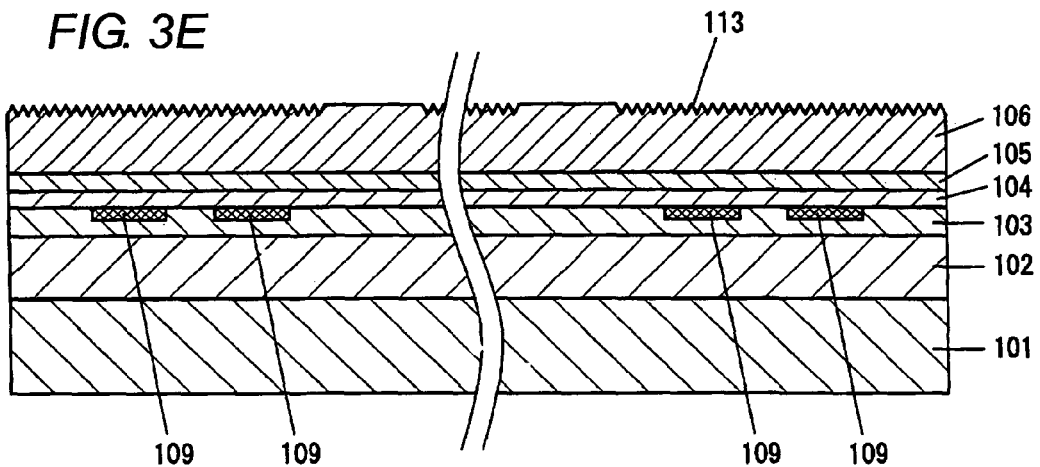
FIG. 3E is a view showing a production process of the light-emitting device of Example 1.

Next, a mask containing $SiO_2$ is formed in a region where the n-electrode 107 is formed later, on the first surface of the n-type layer 106 exposed by the removal of the sapphire substrate 114. Thereafter, the wafer is immersed in an aqueous solution of TMAH (tetramethylammonium hydroxide) in a concentration of 22%, thereby forming the fine unevenness 113 in a region not covered with the mask, on the surface of the n-type layer 106. Thereafter, the mask is removed by buffered hydrofluoric acid (FIG. 3E). For the formation of the fine unevenness, an aqueous solution of KOH, NaOH or the like can also be used, instead of TMAH.

Figure 3F:
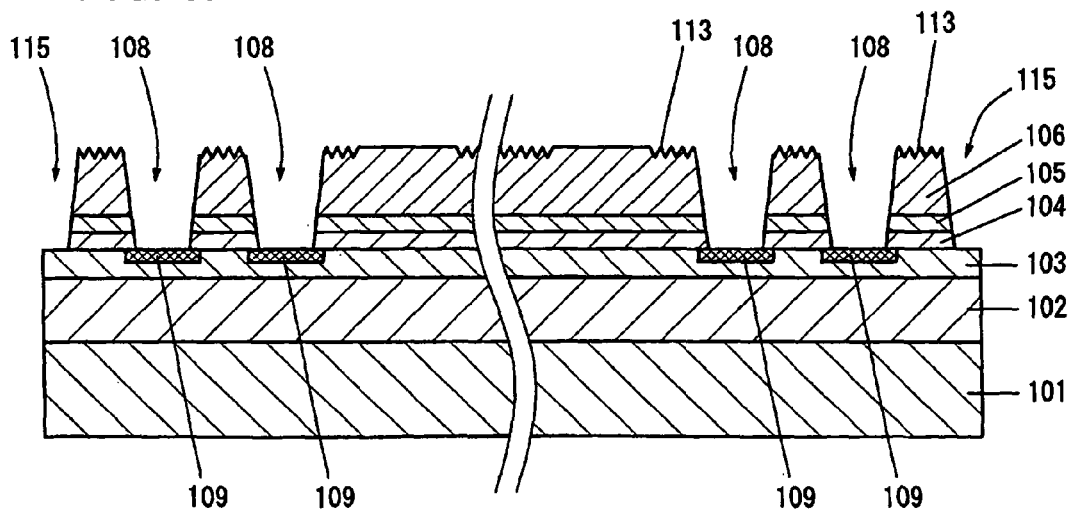
FIG. 3F is a view showing a production process of the light-emitting device of Example 1.

Then, a mask containing $SiO_2$, is formed so as to have a pattern in which windows are opened in regions where the grooves 108 and mesa grooves 115 for device separation are formed. The regions where the grooves 108 are formed are positions which oppose the etching stopper layers 109 in a device vertical direction. The regions where no mask is formed are dry etched by using Cl plasma or the like. The etching stopper layers 109 are previously formed herein, so that the grooves 108 which penetrate the n-type layer 106, the active layer 105 and the p-type layer 104 and have a depth reaching the etching stopper layers 109 can be easily formed with good precision. Further, the mesa grooves 115 for device separation which penetrate the n-type layer 106, the active layer 105 and the p-type layer 104 are also formed at the same time as the formation of the grooves 108. Thereafter, the mask is removed by buffered hydrofluoric acid (FIG. 3F). As described above, the grooves 108 and the mesa grooves 115 can be formed at the same time, so that the grooves 108 can be produced at the same process number as that of conventional methods.

Incidentally, the fine unevenness 113 may be formed, after the grooves 108 and the mesa grooves 115 are previously formed. Further, the grooves 108 and the mesa grooves 115 may be formed by wet etching using the TMAH aqueous solution in the same manner as in the case of forming the fine unevenness 113.

Then, the insulating film 110 is formed on side surfaces of the grooves 108 and side surfaces of the mesa grooves 115, in order to prevent leak and short circuit of current, and the n-electrode 107 including the wiring-shaped portion 111 and the two pad portions 112 is formed on the flat n-type layer 106 where no fine unevenness 113 is formed, by a lift-off process using a resist. The support 101 is polished to reduce the thickness thereof, and then a back surface electrode (not shown) is formed on a surface of the support 101 which is opposite to the low-melting-point metal layer 102. Then, chip separation is performed by laser dicing to produce the light-emitting device 100 shown in FIG. 1.

The light-emitting device 100 produced as described above was compared in light output with a light-emitting device of Comparative Example having the same configuration as the light-emitting device 100, with the exception that no grooves 108 were formed. As a result, the light output of the light-emitting device 100 was about 15% higher than that of the light-emitting device of Comparative Example. Further, the driving voltage of the light-emitting device 100 was about the same as that of the light-emitting device of Comparative Example.

Incidentally, the plurality of grooves are formed in dot form in Example. However, the grooves are not necessarily required to be formed in dot form. The shape may be any, as long as it is a shape which is continuous without dividing the n-type layer surface.

Further, in Example, the grooves having a depth so as to penetrate the p-type layer from the n-type layer surface are formed. However, the grooves are not necessarily required to penetrate, and only required to have a depth at least reaching the p-type layer. Still further, the etching stopper layer is also not necessarily required.

Furthermore, in Example, laser lift-off is used for the removal of the sapphire substrate. However, chemical lift-off may be used in which a buffer layer which can be dissolved with a chemical solution is formed between the sapphire substrate and the n-type layer, and dissolved with the chemical solution after joining to the support to separate and remove the sapphire substrate.

The group III nitride semiconductor light-emitting device of the embodiment and example as described above can be used in display devices, lighting systems, etc.

What is claimed is:

1. A group III nitride semiconductor light-emitting device, comprising:
   a conductive support;
   a p-electrode positioned on the conductive support, a p-type layer comprising a group III nitride semiconductor, an active layer, and an n-type layer comprising a surface, which are positioned in turn on the p-electrode; and
   an n-electrode disposed on the surface of the n-type layer,
   wherein a plurality of separated grooves are fanned in the surface of the n-type layer in a pattern such that the surface of the n-type layer is continuous,
   wherein a light-transmitting insulating film is formed on a side surface and a bottom surface of each of the grooves so as to define a void extending from the n-type layer toward the p-type layer,
   wherein said each of the grooves comprises a depth at least reaching the p-type layer, and
   wherein the n-electrode is formed in a wiring form.

2. The group III nitride semiconductor light-emitting device according to claim 1, wherein the pattern comprises a pattern in which the grooves comprising a plurality of dot-shaped grooves are formed.

3. The group III nitride semiconductor light-emitting device according to claim 2, wherein the grooves are arranged in a matrix form.

4. The group III nitride semiconductor light-emitting device according to claim 1, wherein said each of the grooves penetrates the p-type layer.

5. The group III nitride semiconductor light-emitting device according to claim 4, wherein an etching stopper layer is formed on the bottom surface of said each of the grooves.

6. The group III nitride semiconductor light-emitting device according to claim 1, wherein the p-type layer is disposed on a surface of the p-electrode.

7. The group III nitride semiconductor light-emitting device according to claim 1, wherein the p-type layer abuts an upper surface of the p-electrode.

8. The group III nitride semiconductor light-emitting device according to claim 1, wherein the surface of the n-type layer abuts the n-electrode.

9. The group III nitride semiconductor light-emitting device according to claim 1, wherein, with respect to a bottom surface of the p-electrode, a height of a bottom surface of the light-transmitting insulating film is the same as a height of an upper surface of the p-electrode.

10. The group III nitride semiconductor light-emitting device according to claim 1, further comprising an embedded layer embedded in the p-electrode such that a bottom surface of the light-transmitting insulating film is disposed on an upper surface of the embedded layer.

11. The group III nitride semiconductor light-emitting device according to claim 10, wherein the embedded layer comprises an etching stopper layer that extends below an upper surface of the p-electrode.

12. The group III nitride semiconductor light-emitting device according to claim 10, wherein the embedded layer is disposed within the p-electrode such that the upper surface of the embedded layer is flush with an upper surface of the p-electrode.

13. A group III nitride semiconductor light-emitting device, comprising:
   a conductive support;
   a p-electrode positioned on the conductive support, a p-type layer comprising a group III nitride semiconductor, an active layer, and an n-type layer comprising a surface, which are positioned in turn on the p-electrode;
   an n-electrode disposed on the surface of the n-type layer,
   wherein a groove is formed in the surface of the n-type layer in a pattern such that the surface of the n-type layer is continuous,
   wherein a light-transmitting insulating film is formed on a side surface and a bottom surface of the groove,
   wherein the groove comprises a depth at least reaching the p-type layer, and
   wherein the n-electrode is formed in a wiring form; and
   an etching stopper layer disposed on the bottom surface of the groove,
   wherein the etching stopper layer is disposed within the p-electrode such that an upper surface of the etching stopper layer is flush with an upper surface of the p-electrode.

14. A group III nitride semiconductor light-emitting device, comprising:
   a conductive support;
   a p-electrode disposed on the conductive support;
   a p-type layer comprising a group III nitride semiconductor disposed on an upper surface of the p-electrode;
   an active layer disposed on a surface of the p-type layer;
   an n-type layer disposed on a surface of the active layer; and
   an n-electrode disposed on a surface of the n-type layer,
   wherein a groove is formed in the surface of the n-type layer,
   wherein a light-transmitting insulating film is found on a side surface and a bottom surface of the groove, and
   wherein the groove extends to the p-type layer; and
   an etching stopper layer disposed on the bottom surface of the groove,
   wherein the etching stopper layer is disposed within the p-electrode such that an upper surface of the etching stopper layer is flush with the upper surface of the p-electrode.

* * * * *